United States Patent [19]

Leclerc et al.

[11] 4,041,191

[45] Aug. 9, 1977

[54] RESINS FOR USE AS ELECTRON RESISTS

[76] Inventors: Pierre Leclerc; Jean Claude Dubois, both of 173 Bld Hausmann, 75008 Paris, France

[21] Appl. No.: 629,543

[22] Filed: Nov. 6, 1975

[30] Foreign Application Priority Data

Nov. 8, 1974 France .................................. 74.37077

[51] Int. Cl.² ............................................. B05D 3/06
[52] U.S. Cl. ....................................... 427/43; 96/35.1; 96/36.2; 96/115 R; 427/44; 427/273
[58] Field of Search .......................... 427/43, 44, 273; 96/35.1, 36.2, 27 R, 115 R

[56] References Cited

U.S. PATENT DOCUMENTS

| 2,413,973 | 1/1947 | Honk et al. ............................ 427/44 |
| 3,628,963 | 12/1971 | Akamatsu et al. .................. 96/115 R |
| 3,799,915 | 3/1974 | Dunnavant et al. .................. 96/35.1 |
| 3,840,390 | 10/1974 | Kozu et al. ......................... 96/115 R |
| 3,859,099 | 1/1975 | Petropoulos et al. ............. 96/115 R |

Primary Examiner—John H. Newsome

[57] ABSTRACT

An electron sensitive resin comprising a random polymer of ethylene glycol methacrylate with triethylene glycol dimethacrylate, randomly crosslinked, and having a degree of polymerization of from 10 to 1000, is described.

4 Claims, No Drawings

RESINS FOR USE AS ELECTRON RESISTS

This invention is concerned with electron-sensitive resins and their use in the manufacture of high resolution (e.g., of the order of a fraction of a micron) masks, especially for use in the manufacture in electronic components. In particular, the invention relates to new electron-sensitive resins whose sensitivity and resolution characteristics are not dependent upon the conditions of development.

In the production of masks, especially for the manufacture of electronic components (either unitary components or a group of components in the form of an integrated circuit) there are used resins which are sensitive to light (so-called "photoresists") or electrons (so-called "electron resists").

In the case of positive-working electron resists, namely resins which are degraded by the action of a beam of electrons acting for a time $t$ upon a surface $s$ and having a total intensity $i$, the sensitivity of the resin is defined by the quantity, $q$, of electricity necessary to degrade the resin, that is to render it soluble under the action of the appropriate developing agents, and, thus, $$q_1 = \frac{i\,t}{s} \tag{1}$$

The resolving power of an electron resists, as in the case of all masking products, is determined by the width of the finest line or the minimal distance between two lines which can be effectively reproduced. The development of a resin mask after exposure to electrons, gives varying results depending upon the developing agents employed. Thus, for example in the case of polymethacrylate, in order to obtain the best performance from the resin there is used as developing agent a mixture of methylisobutyl ketone and isopropyl alcohol in particular ratios (60–40), whilst particular attention has to be paid to the time and temperature of development. The sensitivity of this resin is $3 \times 10^{-5}$ coul/cm$^2$ for an energy of 20 KeV.

It follows, therefore, that the use of such a resin as an electron resist involves fairly strict constraints both as regards the selection of the solvents used as developing agents and as regards the precise conditions of use of these solvents.

The present invention relates to an improvement in such resins in that it provides a new resin which may be used as a photoresist and which has the advantage of being developable with a single solvent and without acquiring the above noted constraints. Further, the new resin according to the invention has a generally increased sensitivity to electrons.

According to the invention there is provided an electro-sensitive resin comprising a random polymer of ethylene glycol methacrylate cross-linked with triethylene glycol dimethacrylate, randomly crosslinked, and have a degree of polymerization of from 10 to 1000.

The structure of the polymer in accordance with the invention may be represented by the formula:

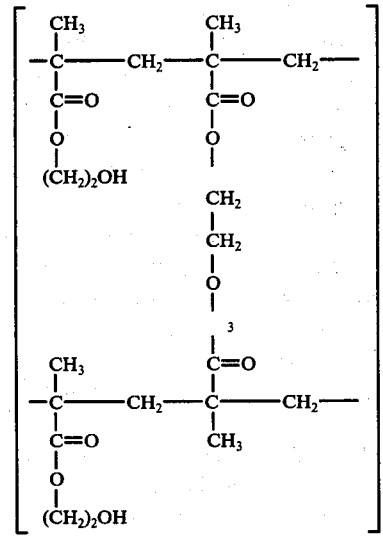

in which $n$ is an integer from 10 to 1,000.

The resin in accordance with the invention has the following properties.

a. The resin is soluble in hydroxylic solvents and notably in water as well as alcohols such as isopropanol;

b. The resin has a sensitivity of the order of $3 \times 10^{-6}$ coulomb/cm$^2$ for a beam of electrons having an energy of 20 KeV; and c. No particular conditions of time or temperature are required in the use of the resin or its treatment with developing solvents in the manufacture of electronic components.

The group of three qualities is unique for resins used in electron resist, especially in comparison with prior art resins.

The resin in accordance with the invention may be prepared in situ on the required substrate by the following process:

a. Ethylene glycol monomethacrylate is dissolved in an equal volume of pure water and there is added to the solution 0.1% by weight, based on the weight of the solution, of gold chloride;

b. 70% by volume of triethylene glycol dimethacrylate are dissolved in 30% by volume of ethylene glycol;

c. an aqueous 5% solution of ammonium persulphate is prepared;

d. 100 cc of each of the solutions from (a) and (b) are mixed together and there is added thereto 10 cc of the solution from (c);

e. a fine layer of the mixture from (d) is deposited, by centrifugation, on a substrate placed on a support rotating at high speed;

f. the deposited layer from step (e) is heat treated for 10 minutes in a furnace maintained at a constant temperature of 100° C.

One thus obtains a layer of copolymer of the formula given above in which $n$ is from 30 to 150, as determined by gel chromatography and viscometry.

The substrate used may be, for example, a polished wafer of silica. After decomposition of the layer and its heat treatment, the whole assembly may be then subjected to treatment with electrons in a suitable apparatus for preparing masks using a beam of electrons, for example the apparatus known under the name "Masqueur Thomson CSF". After treatment with the electrons the wafer is dipped in water for two to three minutes and it is found that the portions of the copolymer which have been subjected to treatment for the electrons are perfectly developed, i.e., wholly removed.

A similar result may be obtained using an alcohol, such as isopropanol, in place of the water.

It has been found that the sensitivity of the masking resin, obtained as described above, is of the order of from $10^{-7}$ to $10^6$ coul/cm$^2$ for electron energies of from 5 to 30 KeV respectively and is of the order of $3 \times 10^{-6}$ coul/cm$^2$ for energies of the order of 20 KeV.

The masks obtained in accordance with the invention have a high resolution (of the order of 0.3 microns) which may be used in the production of electronic components, especially integrated circuits.

The present invention provides an improvement in the production of such electronic components because of the new and unique qualities of the resin of the invention, as compared with previously employed resins.

What we claim is:

1. A resin for use as an electron resist comprising a random polymer of ethylene glycol monomethacrylate with triethylene glycol dimethacrylate, and randomly crosslinked, and having a degree of polymerization of from 10 to 1000.

2. A resin as claimed in claim 1 having the structure:

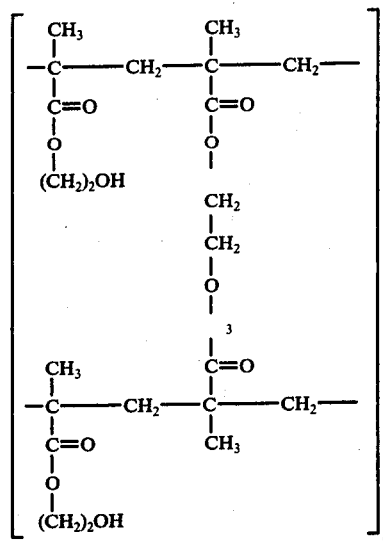

in which $n$ is an integer from 10 to 1000.

3. A method of forming a mask upon a substrate which comprises forming a layer of resin as claimed in claim 1 upon a substrate; exposing the layer of resin imagewise to the action of a beam of electrons; and removing exposed resin by the action of a hydroxylic solvent.

4. A method as claimed in claim 3 in which the masked substrate is subsequently subjected to further treatment.

* * * * *